United States Patent
Lee et al.

(10) Patent No.: US 7,843,129 B2
(45) Date of Patent: Nov. 30, 2010

(54) WHITE ORGANIC LIGHT EMITTING DEVICE AND DISPLAY APPARATUS AND LIGHTING APPARATUS COMPRISING THE SAME

(75) Inventors: Sung-Hun Lee, Yongin-si (KR);
Sang-Yeol Kim, Yongin-si (KR);
Young-Mok Son, Yongin-si (KR);
Mu-Gyeom Kim, Yongin-si (KR);
Jung-Bae Song, Yongin-si (KR)

(73) Assignees: Samsung Electronics Co., Ltd., Maetan-dong Yeongtong-gu, Suwon-si, Gyeonggi-do (KR); Samsung Mobile Display Co., Ltd., Nongseo-Dong, Giheung-Gu, Yongin, Gyunggi-Do (KR)

(*) Notice: Subject to any disclaimer, the term of this patent is extended or adjusted under 35 U.S.C. 154(b) by 196 days.

(21) Appl. No.: 12/081,688

(22) Filed: Apr. 18, 2008

(65) Prior Publication Data
US 2009/0072720 A1  Mar. 19, 2009

(30) Foreign Application Priority Data
Sep. 17, 2007  (KR) .................... 10-2007-0094214

(51) Int. Cl.
*H01J 1/63* (2006.01)
(52) U.S. Cl. .................. 313/504; 313/505; 313/506
(58) Field of Classification Search ......... 313/495–512; 315/169.3, 169.4; 257/40, 79; 428/690; 345/30, 36, 44–45; 252/72, 181.1, 194
See application file for complete search history.

(56) References Cited

U.S. PATENT DOCUMENTS

2004/0046495 A1*  3/2004  Peng ........................ 313/504
2006/0227079 A1* 10/2006  Kashiwabara ............... 345/76

FOREIGN PATENT DOCUMENTS

EP       1755362 A1  *  2/2007

* cited by examiner

*Primary Examiner*—Bumsuk Won
*Assistant Examiner*—Elmito Breval
(74) *Attorney, Agent, or Firm*—Robert E. Bushnell, Esq.

(57) ABSTRACT

Provided is a white organic light emitting device and a display apparatus and a lighting apparatus that include the white organic light emitting device. The white organic light emitting device comprises an anode, a hole transport layer, a light emitting layer, an electron transport layer, and a cathode. The light emitting layer includes a red light emitting layer, a blue light emitting layer, and a green light emitting layer sequentially formed from the anode. A functional layer, which blocks an energy transfer and controls electron mobility between the light emitting layers, is formed between the red light emitting layer and the blue light emitting layer or between the blue light emitting layer and the green light emitting layer. The functional layer formed between the red light emitting layer and the blue light emitting layer has a thickness of 50 to 100 Å.

25 Claims, 5 Drawing Sheets

WHITE ORGANIC LIGHT EMITTING DEVICE AND DISPLAY APPARATUS AND LIGHTING APPARATUS COMPRISING THE SAME

CLAIM OF PRIORITY

This application makes reference to, incorporates the same herein, and claims all benefits accruing under 35 U.S.C. §119 from an application earlier filed in the Korean Intellectual Property Office on 17 Sep. 2007 and there duly assigned Serial No. 10-2007-0094214.

BACKGROUND OF THE INVENTION

1. Field of the Invention

The present invention relates to a light emitting device and an apparatus comprising the same, and more particularly, to a white organic light emitting device having high light luminous efficiency and low power consumption, and a display apparatus and a lighting apparatus comprising the white organic light emitting device.

2. Description of the Related Art

Organic light emitting devices (OLEDs) are emissive display devices that use light generated from combinations of electrons and holes, which are supplied to a fluorescent or phosphorus organic compound thin film (hereinafter, an organic thin film). Generally, an OLED has a structure in which an anode, a hole transporting layer, a light emitting layer, an electron transporting layer, and a cathode are sequentially formed on a substrate.

A white OLED can emit white light, and can be used for various purposes such as a paper-thin light source, a backlight of a liquid crystal display apparatus, or a full color display apparatus that employs color filters.

Methods of manufacturing the white OLED can be divided into two types according to the method of manufacturing a light emitting layer. The first type refers to methods of manufacturing the light emitting layer in a single layer (a first conventional method). The second type refers to methods of manufacturing the light emitting layer in multiple layers (a second conventional method).

The first conventional methods include a method of doping red, green, and blue dopants in one host and a method of doping red and green dopants in a blue host. In this case, however, it is difficult to block an energy transfer between dopants, and thus, the luminous efficiency of the white OLED is reduced although the doping concentration of the dopants is controlled.

In the second conventional methods, a stacked light emitting layer is formed by stacking a red light emitting layer, a green light emitting layer, and a blue light emitting layer. In this case, however, it is not easy to obtain a high luminous efficiency and a uniform spectrum of the three primary colors due to difficulties in dispersing excitons in each of the light emitting layers, and a large energy transfer occurs between the light emitting layers.

SUMMARY OF THE INVENTION

To address the above and/or other problems, the present invention provides a white organic light emitting device that has high luminous efficiency and low power consumption.

The present invention also provides a display apparatus that includes the white organic light emitting device.

The present invention also provides a lighting apparatus that includes the white organic light emitting device.

The present invention provides a white organic light emitting device comprising a functional layer that blocks an energy transfer and controls electron mobility in the light emitting layer.

According to an aspect of the present invention, there is provided a white organic light emitting device including an anode, a hole transport layer, a light emitting layer, an electron transport layer, and a cathode. The light emitting layer includes a red light emitting layer that emits red light, a blue light emitting layer that emits blue light, and a green light emitting layer that emits green light. The red, blue, and green light emitting layers are sequentially formed from the anode. A functional layer is formed between the red light emitting layer and the blue light emitting layer, or formed between the blue light emitting layer and the green light emitting layer. The functional layer blocks an energy transfer between the red light emitting layer and the blue light emitting layer or an energy transfer between the blue light emitting layer and the green light emitting layer, and controls electron mobility in the light emitting layer. The functional layer, if formed between the red light emitting layer and the blue light emitting layer, has a thickness of 50 to 100 Å.

The functional layer formed between the red light emitting layer and the blue light emitting layer, which is a first functional layer, may have a hole transport characteristic, may have an energy band gap greater than that of the blue light emitting layer, and may have the lowest unoccupied molecular orbital (LUMO) level that is greater than that of the blue light emitting layer. The first functional layer may have a LUMO level of 2.3 to 2.6 eV, and may have the highest occupied molecular orbital (HOMO) level of 5.2 to 5.8 eV. The first functional layer may include at least one material selected from the group consisting of an oxadiazole compound having an amino substituent, a triphenyl compound having an amino substituent, a triphenylmethane compound having an amino substituent, a tertiary compound, a hydrazone compound, a pyrazoline compound, an enamine compound, a styryl compound, a stilbene compound, and a carbazole compound The functional layer formed between the blue light emitting layer and the green light emitting layer, which is a second functional layer, may have a thickness of 10 to 50 Å. The second functional layer may have an electron transport characteristic, may have an energy band gap greater than that of the blue light emitting layer, and may have a HOMO level lower than that of the blue light emitting layer. The second functional layer may have a HOMO level of 5.7 to 6.4 eV, and may have a LUMO level of 2.7 to 3.1 eV. The second functional layer formed between the blue light emitting layer and the green light emitting layer may include at least one material selected from the group consisting of an anthracene compound, a phenanthracene compound, a pyrene compound, a perylene compound, a chrysene compound, a triphenylene compound, a fluoranthene compound, a periflanthene compound, an azole compound, a diazole compound, and a vinylene compound.

The white organic light emitting device may further include a hole blocking layer between the light emitting layer and the electron transport layer. The hole blocking layer may include at least one material selected from the group consisting of an oxadiazole derivative, a triazole derivative, a phenanthroline derivative, a anthracene derivative, 2,9-Dimethyl-4,7-diphenyl-1,10-phenanhro-line (BCP), and an aluminum complex. The hole blocking layer may be an aluminum (III) bis(2-methyl-8-quinolinato) 4-phenylphenolate (Balq) layer.

The white organic light emitting device may further include an electron blocking layer between the hole transport layer and the light emitting layer. The white organic light emitting device may further include a hole injection layer between the anode and the hole transport layer. The white organic light emitting device may further include an electron injection layer between the cathode and the electron transport layer.

Each of the red light emitting layer, the blue light emitting layer, and the green light emitting layer may include an organic host and a light emitting dopant. The organic host of the red light emitting layer may have a hole transport characteristic and may have a HOMO level of 5.2 to 5.8 eV. The light emitting dopant may be a fluorescent or phosphorus organic molecule or an organic-metal complex. The content of the light emitting dopant in each of the red light emitting layer, the blue light emitting layer, and the green light emitting layer may be 0.2 to 30 wt %.

The anode may be formed of a conductive material having high work function. For example, the anode may be formed of at least one material selected from the group consisting of IZO (indium zinc oxide), ITO (indium tin oxide), $SnO_2$, ZnO, Ni, Ag, Au, Al, Pt, Pd, Rh, Ru, Ir, W, Mo, Cr, Ta, Nb, or an alloy of these materials. Also, the anode may have a single layer structure or a multilayer structure.

The hole transport layer may include at least one material selected from the group consisting of an oxadiazole compound having an amino substituent, a triphenyl compound having an amino substituent, a triphenylmethane compound having an amino substituent, a tertiary compound, a hydrazone compound, a pyrazoline compound, an enamine compound, a styryl compound, a stilbene compound, and a carbazole compound. The hole transport layer may or may not include a p-type dopant. The p-type dopant may be included in order to increase the electrical conductivity of the hole transport layer. The p-type dopant may have a LUMO level lower than a HOMO level of the hole transport layer. If the hole transport layer includes the p-type dopant, the content of the p-type dopant in the hole transport layer may be 0.1 to 30 wt %, preferably, 1 to 6 wt %. The hole transport layer may have an electrical conductivity in a range from $10^{-5}$ S/cm to $10^{-3}$ S/cm.

The electron transport layer may include at least one material selected from the group consisting of an anthracene compound, a phenanthracene compound, a pyrene compound, a perylene compound, a chrysene compound, a triphenylene compound, a fluoranthene compound, a periflanthene compound, an azole compound, a diazole compound, and a vinylene compound. The electron transport layer may or may not include an n-type dopant. The n-type dopant may be included to increase electrical conductivity of the electron transport layer, and the n-type dopant may have a HOMO level greater than the LUMO level of the electron transport layer. If the electron transport layer includes the n-type dopant, the content of the n-type dopant may be 0.1 to 50 wt %, preferably 10 to 20 wt %. The electron transport layer may have an electrical conductivity in a range from $10^{-5}$ S/cm to $10^{-3}$ S/cm.

The white organic light emitting device may have an electron/hole balance factor γ of 0.8 to 1.0.

The cathode may be formed of a conductive material having small work function. For example, the cathode may be formed of a material selected from the group consisting of Li, Mg, Ca, Ag, Al, In, ITO, IZO, or an alloy of these materials. The cathode may have a single layer structure or a multilayer structure.

The white organic light emitting device may further include an electron injection layer between the cathode and the electron transport layer. The electron injection layer may be a metal compound layer including halogen or oxygen.

According to an aspect of the present invention, there is provided a full color display apparatus including the white organic light emitting device described above and color filters.

According to an aspect of the present invention, there is provided a liquid crystal display apparatus including the white organic light emitting device described above as a backlight unit.

According to an aspect of the present invention, there is provided a lighting apparatus including the white organic light emitting device described above as a light source.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

The present invention will now be described more fully with reference to the accompanying drawings in which exemplary embodiments of the invention are shown. In the drawings, the thicknesses of layers and regions are exaggerated for clarity.

Figure 1:
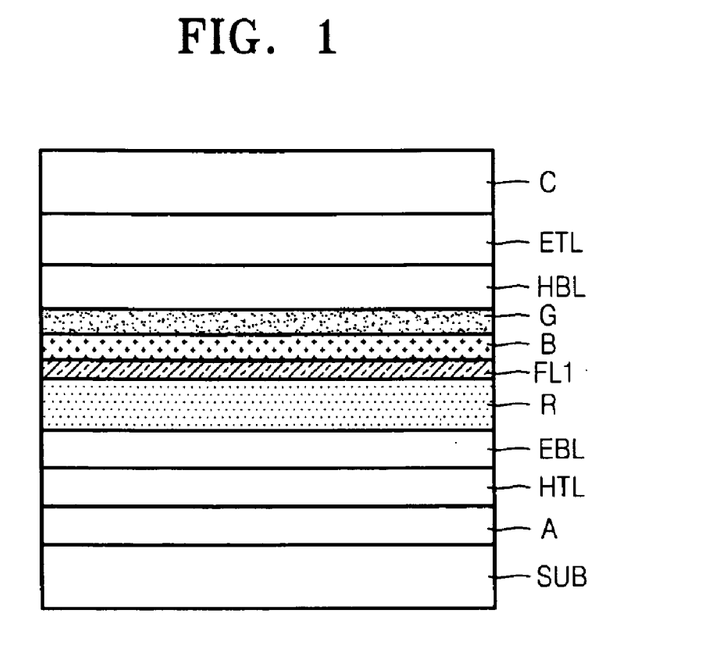
FIG. 1 is a cross-sectional view of a white organic light emitting device (OLED) according to an embodiment of the present invention.

FIG. 1 is a cross-sectional view of a white organic light emitting device (OLED) according to an embodiment of the present invention.

Referring to FIG. 1, an anode A is formed on a transparent substrate SUB such as a glass substrate. In the present embodiment, the anode A is formed of indium tin oxide (ITO). However, the anode A can be a layer formed of other materials, for example, at least one material selected from the group consisting of IZO, ITO, $SnO_2$, ZnO, Ni, Ag, Au, Al, Pt, Pd, Rh, Ru, Ir, W, Mo, Cr, Ta, Nb, or an alloy of these materials. Also, the anode A can have a single layer structure or a stacked layer structure. The surfaces of the anode A and the transparent substrate SUB are washed using a neutral detergent, deionized water (DI water), or isopropyl alcohol (IPA), and are treated with ultraviolet rays-ozone.

A hole transport layer (HTL) HTL and an electron blocking layer (EBL) EBL are sequentially formed on the anode A. The HTL can include at least one selected from the group consisting of an oxadiazole compound having an amino substituent, a triphenyl compound having an amino substituent, a triphenylmethane compound having an amino substituent, a tertiary compound, a hydrazone compound, a pyrazoline compound, an enamine compound, a styryl compound, a stilbene compound, and a carbazole compound, and may have a thickness of 100 to 1000 angstrom (Å). The HTL includes a p-type dopant for increasing the electrical conductivity thereof. The content of the p-type dopant may be 0.1 to 30 wt %, and preferably can be determined in a range from 1 to 6 wt %. When the content of the p-type dopant is 1 to 6 wt %, the HTL may have an electrical conductivity of $10^{-5}$ S/cm to $10^{-3}$ S/cm. The HTL may not include the p-type dopant, and in this case, the EBL may not be included. If the EBL is included, the thickness of the EBL can be 20 to 300 Å.

A light emitting layer that includes a red light emitting layer R, a blue light emitting layer B, and a green light emitting layer G is formed on the EBL. More specifically, the red light emitting layer R having a thickness of 10 to 300 Å is formed on the EBL. The red light emitting layer R can include a first organic host and a red light emitting dopant. The content of the red light emitting dopant can be 0.2 to 30 wt %. The blue light emitting layer B formed above the red light emitting layer R can include a second organic host and a blue light emitting dopant, and has a thickness of 10 to 300 Å. The content of the blue light emitting dopant in the blue light emitting layer B can be 0.2 to 30 wt %. The green light emitting layer G formed above the blue light emitting layer B can include a third organic host and a green light emitting dopant, and has a thickness of 10 to 300 Å. The content of the green light emitting dopant in the green light emitting layer G can be 0.2 to 30 wt %. The light emitting dopants included in the red light emitting layer R, the blue light emitting layer B, and the green light emitting layer G can be organic molecules or organic-metal complex having fluorescent or phosphorus characteristics.

A first functional layer FL1 that blocks an energy transfer and charge movement is formed between the red light emitting layer R and the blue light emitting layer B. The first functional layer FL1 may have an energy band gap greater than that of the blue light emitting layer B. Due to the first functional layer FL1 having the above characteristics, the transfer of energy from the blue light emitting layer B to the red light emitting layer R can be prevented. The first functional layer FL1 may have a hole transporting characteristic and may have the lowest unoccupied molecular orbital (LUMO) level that is greater than that of the blue light emitting layer B or those of the blue light emitting layer B and the red light emitting layer R. Due to the first functional layer FL1 having the above characteristics, an amount of electrons that move from the blue light emitting layer B to the red light emitting layer R can be controlled. Thus, a white OLED having high luminous efficiency can be realized. Also, a white OLED, which can emit white light in a range of color coordinate (Cx: 0.26-0.33, Cy: 0.27-0.35) that is suitable for a display, can be realized, since the present invention can increase the exciton density of the blue light emitting layer B (a large exciton density in the blue light emitting layer B is preferable in a white OLED). In order for the first functional layer FL1 to effectively block the transfer of energy and to appropriately control the mobility of electrons, the first functional layer FL1 may have a thickness of 50 to 100 Å, which will be described later.

The first functional layer FL1 can include at least one selected from the group consisting of an oxadiazole compound having an amino substituent, a triphenyl compound having an amino substituent, a triphenylmethane compound having an amino substituent, a tertiary compound, a hydrazone compound, a pyrazoline compound, an enamine compound, a styryl compound, a stilbene compound, and a carbazole compound. The first functional layer FL1 formed of the above material can have a LUMO level of 2.3 to 2.6 eV, and a highest occupied molecular orbital (HOMO) level of 5.2 to 5.8 eV.

Figure 7:
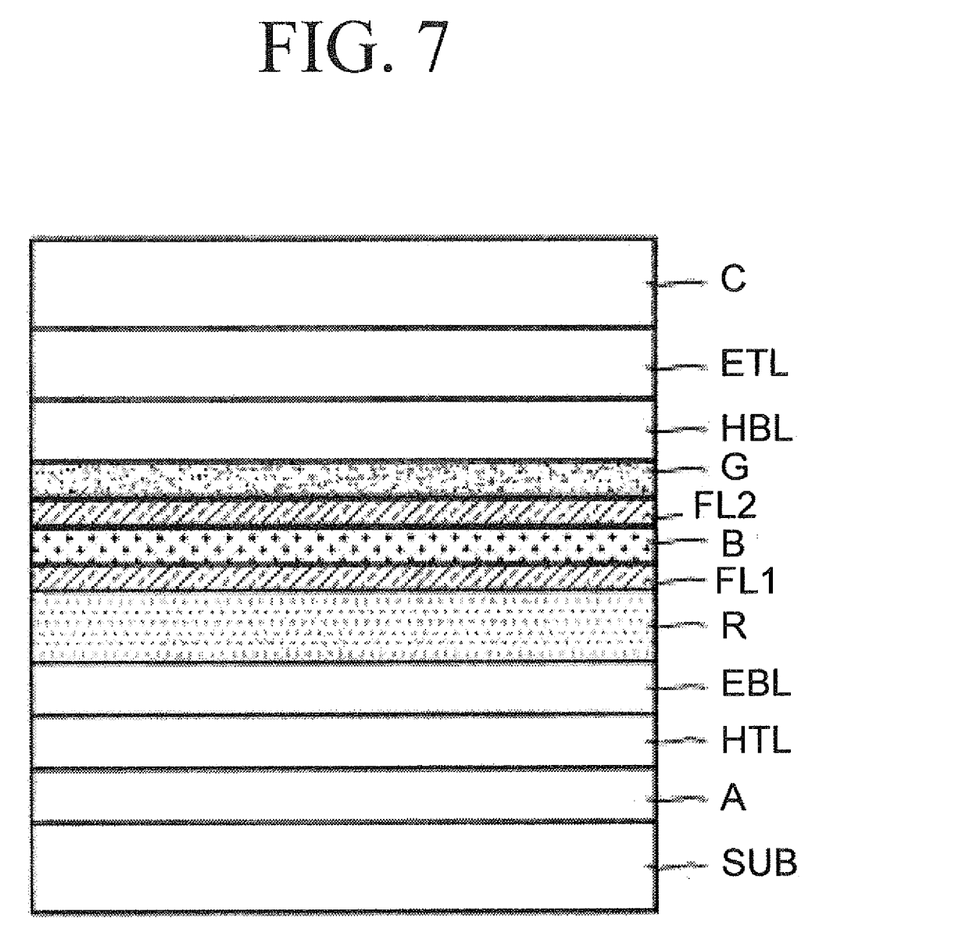
FIG. 7 is a cross-sectional view of a white organic light emitting device (OLED) according to another embodiment of the present invention.

As shown in FIG. 7, a second functional layer FL2 that blocks the transfer of energy and controls the mobility of charges can be formed between the blue light emitting layer B and the green light emitting layer G. The second functional layer FL2, like the first functional layer FL1, may have a band gap greater than that of the blue light emitting layer B. Due to the second functional layer FL2 having the above characteristics, the transfer of energy from the blue light emitting layer B to the green light emitting layer G can be blocked. The second functional layer FL2 may have an electron transporting characteristic, and may have a HOMO level lower than that of the blue light emitting layer B or lower than those of the blue light emitting layer B and the green light emitting layer G. Due to the second functional layer FL2 having the above characteristics, an amount of holes that move from the blue light emitting layer B to the green light emitting layer G can be controlled. In order for the second functional layer FL2 to effectively block the transfer of energy and to appropriately control the mobility of holes, the second functional layer may have a thickness of 10 to 50 Å.

The second functional layer can include at least one selected from the group consisting of an anthracene compound, a phenanthracene compound, a pyrene compound, a perylene compound, a chrysene compound, a triphenylene compound, a fluoranthene compound, a periflanthene compound, an azole compound, a diazole compound, and a vinylene compound. The second functional layer formed of the above material can have a HOMO level of 5.7 to 6.4 eV, and a LUMO level of 2.7 to 3.1 eV.

A hole blocking layer (HBL) HBL is formed on the green light emitting layer G. The HBL is formed of aluminum (III) bis(2-methyl-8-quinolinato) 4-phenylphenolate (Balq), and has a thickness of approximately 110 Å. The material for forming the HBL is not limited to Balq, and can be at least one selected from the group consisting of an oxadiazole derivative, a triazole derivative, a phenanthroline derivative, a anthracene derivative, 2,9-Dimethyl-4,7-diphenyl-1,10-phenanhro-line (BCP), and an aluminum complex. The thickness of the HBL can be in a range from 5 to 200 Å.

An electron transport layer (ETL) ETL is formed on the HBL. The ETL can include at least one selected from the group consisting of an anthracene compound, a phenanthracene compound, a pyrene compound, a perylene compound, a chrysene compound, a triphenylene compound, a fluoranthene compound, a periflanthene compound, an azole compound, a diazole compound, and a vinylene compound, and may have a thickness of 100 to 1000 Å. The ETL includes an n-type dopant for increasing the electrical conductivity thereof. The content of the n-type dopant in the ETL can be in a range from 0.1 to 50 wt %, and preferably, 10 to 20 wt %. When the content of the n-type dopant is 10 to 20 wt %, the electrical conductivity of the ETL can be $10^{-5}$ S/cm to $10^{-3}$ S/cm. The ETL may not include the n-type dopant, and in this case, the HBL may not be included.

A cathode C is formed on the ETL. The cathode C is formed of aluminum and has a thickness of 300 to 3,000 Å. The cathode C can be formed of a material different from aluminum, for example, at least one of Li, Mg, Ca, Ag, Al, In, ITO, IZO, or an alloy of these materials. The cathode C can have a single structure or a stacked structure.

Although not described in the present embodiment, a hole injection layer (HIL) can further be included between the anode A and the HTL, and an electron injection layer (EIL) between the ETL and the cathode C. The EIL can be a metal compound layer that includes halogen or oxygen, for example, a LiF layer.

In the foregoing embodiment of the present invention, when the electrical conductivities of the HTL and the ETL reach an appropriate value, the amount of holes supplied to the light emitting layer and an mount of electrons supplied to the light emitting layer can be appropriately balanced, and thus, a quantum efficiency of the white OLED can be maximized. The electrical conductivities of the HTL and the ETL can be controlled by the amount of p-type and n-type dopants doped to the HTL and the ETL. Therefore, the quantum efficiency of the white OLED can be increased by controlling the doping concentration of the p-type and n-type dopants. The quantum efficiency of the white OLED can be determined by how many excitons, which are pairs of holes and electrons, are generated, how many of the excitons are transferred (that is, re-combining of holes and electrons) to a basic state, and how much light, generated due to the transfer of the excitons, is emitted to the outside of the white OLED. The external quantum efficiency ($\eta_{ext}$) of a white OLED can be expressed using Equation 1.

$$\eta_{ext} = \gamma \eta_r \eta_{PL} \eta_P \qquad \text{Equation 1}$$

where $\gamma$ is a electron/hole balance factor, and is determined according to amount and mobility of charges (that is, electrons and holes) injected into the white OLED. $\eta_r$ is an exciton generation ratio, $\eta_{PL}$ is a photoluminescence quantum efficiency, and $\eta_P$ is an optical output-coupling efficiency.

The value of $\gamma$ can be changed according to the characteristics of the HTL and the ETL, for example, electrical conductivities. In the present embodiment, the value of $\gamma$ can be controlled in a range from 0.8 to 1.0, which is close to a maximum value of 1.0, by controlling the electrical conductivities of the ETL and the HTL by respectively doping an appropriate amount of p-type and n-type dopants into the HTL and the ETL. In this manner, since a value of $\gamma$ close to the maximum value can be obtained, a white OLED having high efficiency can be realized. Also, power consumption of the white OLED can be reduced by maintaining the HTL and the ETL at a relatively high electrical conductivity by respectively doping p-type and n-type dopants into the HTL and the ETL.

In order to control the electrical conductivity of each of the HTL and the ETL, another method can be used instead of controlling the doping concentration of the ETL and the HTL. For example, the HTL and the ETL are formed using at least two materials, for example, first and second materials having mobilities different from each other. However, by controlling the content ratio of the first and second materials, the electrical conductivity of the HTL or the ETL can be controlled. Alternatively, the HTL or the HTL having a multiple layer structure that comprises a first layer formed of the first material and a second layer formed of the second material is formed. However, the electrical conductivity of the HTL or the ETL can be controlled by controlling the thicknesses of the first and second layers.

Hereinafter, a comparative example that is compared to the present embodiment will now be described.

COMPARATIVE EXAMPLE

Figure 2:
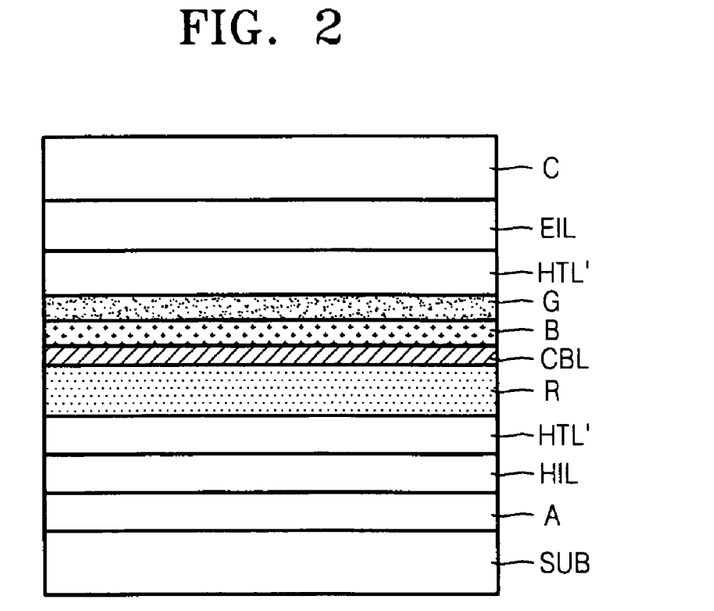
FIG. 2 is a cross-sectional view of a white OLED according to a comparative example.

FIG. 2 is a cross-sectional view of a white OLED according to a comparative example. Like reference numerals are used to indicate identical elements in FIGS. 1 and 2.

In the present comparative example, an anode A, a hole injection layer (HIL) HIL, a hole transport layer (HTL) HTL', a red light emitting layer R, a carrier blocking layer (CBL) CBL, a blue light emitting layer B, a green light emitting layer G, an electron transport layer (ETL) ETL', an electron injection layer (EIL) EIL, and a cathode C are sequentially formed on a transparent substrate SUB. The hole transport layer HTL' and the electron transport layer ETL' do not include a p-type dopant and an n-type dopant. The CBL has a function of blocking a charge movement, but does not have a function of blocking an energy transfer. That is, the CBL can be formed of a material having a hole transporting characteristic similar to the first functional layer FL1 of FIG. 1, but has an energy band gap and thickness different from those of the first functional layer FL1 of FIG. 1.

Table 1 summarizes measurement results of color coordinates Cx and Cy, current efficiency cd/A, external quantum efficiency (%), and lifetime (hour) of white OLEDs according to the present embodiment and the comparative example.

TABLE 1

| Items | Color coordinate (@ 4000 nit) Cx | Cy | Current efficiency (cd/A) (@ 4000 nit) | External quantum efficiency (%) (@ 4000 nit) | Lifetime (hour) (@ 5000 nit) |
|---|---|---|---|---|---|
| Present embodiment | 0.270 | 0.288 | 14.08 | 8.15 | >1800 |
| Comparative example | 0.300 | 0.280 | 11.76 | 6.95 | ~1500 |

In Table 1, the color coordinate, the current efficiency, and the external quantum efficiency were measured at a brightness of 4000 nit, and the lifetime was measured at a brightness of 5000 nit. The current efficiency was measured by respectively applying voltages of 5.15 V and 7.35 V to the white OLEDs of the present embodiment and the comparative example.

As shown in Table 1, the white OLED of the present embodiment has a current efficiency of 14.08 cd/A and an external quantum efficiency of 8.15%, which are approximately 20% higher than those of the white OLED of the comparative example. The white OLED of the present embodiment has a lifetime 20% or more than that of the white OLED of the comparative example.

Table 2 summarizes the measurement results of color coordinate Cx and Cy and current efficiency cd/A of the white OLED of FIG. 1 by varying the electrical conductivities of the HTL and the ETL.

TABLE 2

| Items | current efficiency | | current efficiency | | current efficiency | | current efficiency | | current efficiency | |
|---|---|---|---|---|---|---|---|---|---|---|
| | Cx | Cy | Cx | Cy | Cx | Cy | Cx | Cy | Cx | Cy |
| The electrical conductivity of the ETL increases as it goes upwards | 11.54 | | 11.90 | | 11.96 | | 12.32 | | 12.50 | |
| | 0.304 | 0.288 | 0.302 | 0.286 | 0.302 | 0.286 | 0.303 | 0.288 | 0.304 | 0.287 |
| | 11.20 | | 11.44 | | 11.55 | | 12.00 | | 12.20 | |
| | 0.300 | 0.286 | 0.300 | 0.286 | 0.299 | 0.286 | 0.299 | 0.286 | 0.300 | 0.286 |
| | 11.90 | | 12.00 | | 12.28 | | 12.39 | | 12.54 | |
| | 0.297 | 0.287 | 0.297 | 0.287 | 0.297 | 0.287 | 0.279 | 0.286 | 0.298 | 0.287 |
| | 12.20 | | 12.40 | | 12.77 | | 13.05 | | 13.30 | |
| | 0.294 | 0.284 | 0.294 | 0.285 | 0.294 | 0.286 | 0.294 | 0.286 | 0.295 | 0.287 |
| | 11.25 | | 11.75 | | 12.10 | | 12.40 | | 12.99 | |
| | 0.292 | 0.282 | 0.291 | 0.283 | 0.291 | 0.284 | 0.292 | 0.285 | 0.293 | 0.286 |

The electrical conductivity of the HTL increases as goes left side

Referring to Table 2, when the electrical conductivities of the HTL and the ETL reach an appropriate value, the white OLED can have a high current efficiency of 13 cd/A. Also, the color coordinates of the white OLED of the present embodiment has the color coordinates Cx of 0.26 to 0.33 and Cy of 0.27 to 0.35, which is suitable for white light for a display.

Hereinafter, the reason why the preferable thickness of the first functional layer FL1 of FIG. 1 is 50 to 100 Å will now be described with reference to FIGS. 3 through 6.

Figure 3:
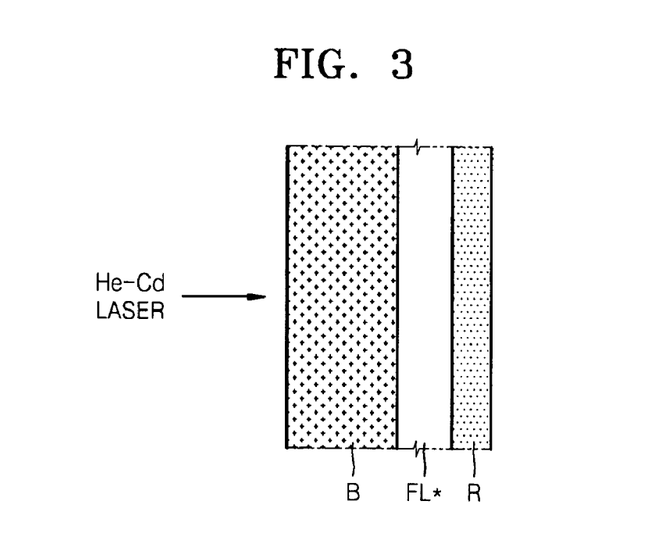
FIG. 3 is a cross-sectional view of a sample manufactured for evaluating the degree of energy transfer according to the thickness of a functional layer that can be used in a white OLED according to an embodiment of the present invention.

FIG. 3 is a cross-sectional view of a sample manufactured for evaluating the degree of energy transfer according to the thickness of a functional layer. Referring to FIG. 3, a test functional layer FL* is interposed between the blue light emitting layer B and the red light emitting layer R. Light coming out from a right side of the red light emitting layer R is detected by radiating a He—Cd laser (monochromatic light having a wavelength of 325 nm) to a left side of the blue light emitting layer B. The test functional layer FL* is a LiF layer and has a band gap energy greater than the blue light emitting layer B, and thus, can have a function of blocking an energy transfer similar to the first functional layer FL1 of FIG. 1. The present experiment is a photoluminescence (PL) test, and is not an electroluminescence (EL) test. Thus, the LiF layer that almost does not absorb light having a wavelength of 325 nm was used. The thicknesses of the blue light emitting layer B and the red light emitting layer R respectively were 150 Å and 50 Å, and the thickness of the test functional layer FL* was increased from 40 Å to 100 Å with a step of 20 Å.

Figure 4:
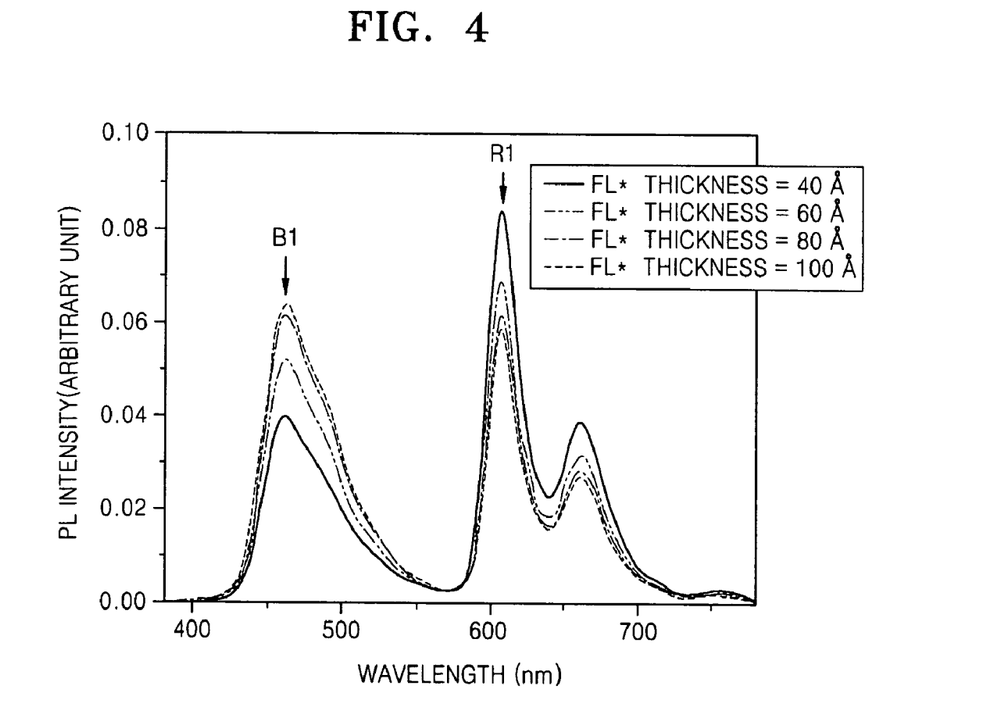
FIG. 4 is a graph showing the variation of photoluminescence (PL) spectrum according to thickness of a test functional layer in a PL test using the sample of FIG. 3.

FIG. 4 is a graph showing the variation of photoluminescence (PL) spectrum according to the thickness of the test functional layer FL* in a PL test using the sample of FIG. 3. Referring to FIG. 4, as the thickness of the test functional layer FL* is increased, a blue spectrum B1 having a wavelength of approximately 460 nm increases, and a red spectrum R1 having a wavelength of approximately 610 nm reduces. However, the degree of variation of spectrums is gradually reduced as the thickness of the test functional layer FL* is increased. The spectrums of the test functional layer FL* samples having a thickness of 80 Å and 100 Å are similar to each other. This is because, if the thickness of the test functional layer FL* is equal to or greater than 80 Å, the energy transfer from the blue light emitting layer B to the red light emitting layer R is repressed. Therefore, the thickness of the test functional layer FL* must be at least 80 Å. From this result, a minimum thickness of the first functional layer FL1 of FIG. 1 can be figured out. When refractive indexes of the test functional layer FL* and the first functional layer FL1 are considered, the thickness of the first functional layer FL1 may be 50 Å or more. More specifically, the refractive indexes of the test functional layer FL* and the first functional layer FL1 measured using light having a wavelength of 460 nm are approximately 1.33 and 2.03 respectively. Thus, based on this result, if a minimum thickness of the first functional layer FL1 is calculated by converting an optical thickness to an actual thickness, the first functional layer FL1 can have a thickness of approximately 50 Å.

Figure 5:
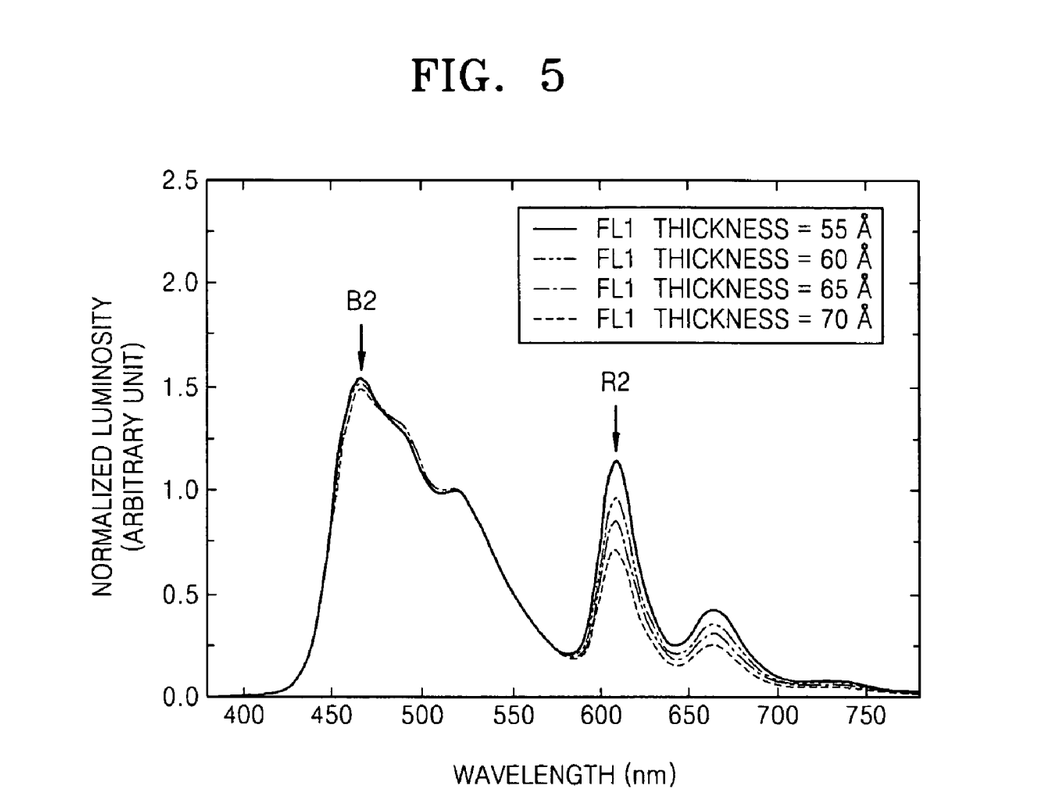
FIG. 5 is a graph showing the variation of light emitting spectrum according to thickness of a functional layer of the white OLED of FIG. 1.

FIG. 5 is a graph showing the variation of light emitting spectrum according to the thickness of the first functional layer FL1 of the white OLED of FIG. 1. Referring to FIG. 5, as the thickness of the first functional layer FL1 is increased, a blue spectrum B2 having a wavelength of approximately 460 nm shows nearly no changes, however, a red spectrum R2 having a wavelength of approximately 610 nm is relatively largely reduced. This is because as the thickness of the first functional layer FL1 is increased, amount of electrons moving from the blue light emitting layer B to the red light emitting layer R reduces due to the first functional layer FL1.

Figure 6:
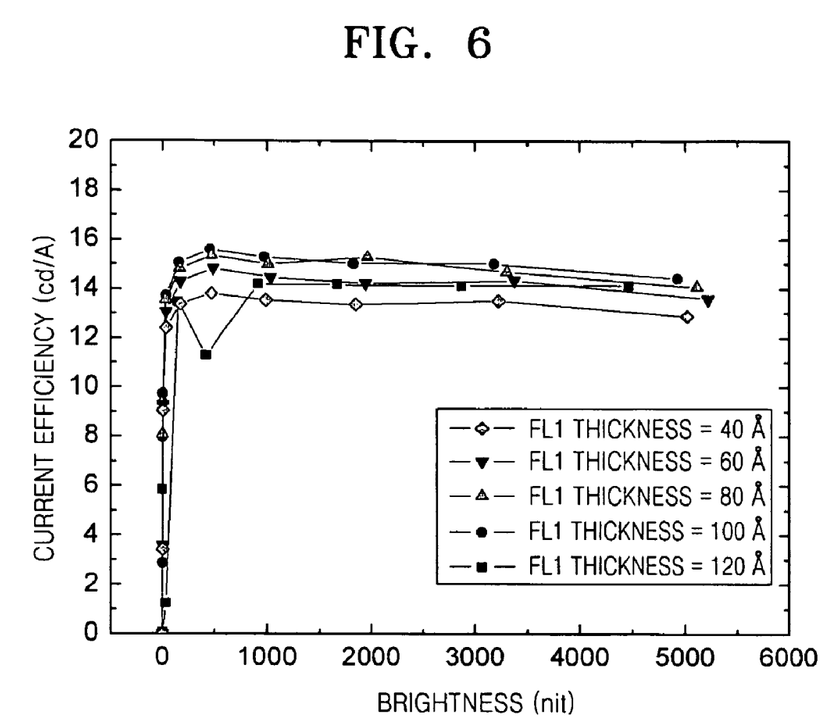
FIG. 6 is graph showing the variation of brightness-current efficiency characteristics according to the thickness of a functional layer of the white OLED of FIG. 1.

FIG. 6 is graph showing the variation of brightness-current efficiency characteristics according to thickness of the first functional layer FL1 of the white OLED of FIG. 1. Referring to FIG. 6, as the thickness of the first functional layer FL1 is increased from 40 to 100 Å, a trend is seen that the current efficiency increases little by little. However, when the thickness of the first functional layer FL1 reaches 120 Å, the current efficiency of the first functional layer FL1 is lower than in the case where the thickness of the first functional layer FL1 is 100 Å. This is because when the thickness of the first functional layer FL1 exceeds 100 Å, the mobility of the electrons is excessively blocked by the first functional layer FL1.

From the results of FIGS. 3 through 6, in order for the first functional layer FL1 to effectively block the transfer of energy and to appropriately control the mobility of electrons, it can be seen that the first functional layer FL1 may have a thickness of 50 to 100 Å. The second functional layer derived from a method similar to the method of determining the preferable thickness range of the first functional layer FL1, that is, a functional layer that can be formed between the blue light emitting layer B and the green light emitting layer G, may have a thickness of 10 to 50 Å.

The white OLED of the present invention can be applied to various fields. For example, the white OLED of the present invention can be employed as an element to various display apparatuses and lighting apparatuses. Thus, the application range of the present invention is not limited to a white OLED, and includes full color display apparatuses that include the white OLED described above and color filters, liquid crystal display apparatuses in which the white OLED is included as a backlight unit, and lighting apparatuses in which the white OLED described above is included as a light source. The configurations of the full color display apparatuses, the liquid crystal display apparatuses, and the lighting apparatuses are well known in the art, and thus, the drawings thereof will be omitted.

The present invention can realize a white OLED that has a high luminous efficiency and can emit white light suitable for display by including at least one functional layer that blocks the transfer of energy and controls the mobility of electrons between light emitting layers.

Also, according to the present invention, the electron/hole balance factor can be maximized in the light emitting layer by controlling the electrical conductivities of a HTL and an ETL, and thus, the external quantum efficiency of the white OLED can be increased and power consumption of the white OLED can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A white organic light emitting device comprising:
    a substrate;
    an anode formed on the substrate;
    a hole transport layer formed on the anode;
    a light emitting layer formed on the hole transport layer, the light emitting layer comprising:
        a red light emitting layer emitting red light;
        a blue light emitting layer formed on the red light emitting layer and emitting blue light;
        a green light emitting layer formed on the blue light emitting layer and emitting green light; and
        a first functional layer formed between the red light emitting layer and the blue light emitting layer and a second functional layer formed between the blue light emitting layer and the green light emitting layer, the first and second functional layers blocking an energy transfer and controlling charge movement between the red light emitting layer and the blue light emitting layer and between the blue light emitting layer and the green light emitting layer, respectively, the first functional layer having a thickness of about 50 angstrom to about 100 angstrom, the second functional layer having an electron transport characteristic, the second functional layer having an energy band gap greater than an energy band gap of the blue light emitting layer, the second functional layer having a highest occupied molecular orbital (HOMO) level lower than a HOMO level of the blue light emitting layer;
    an electron transport layer formed on the light emitting layer; and
    a cathode formed on the electron transport layer.

2. The white organic light emitting device of claim 1, wherein the first functional layer has a hole transport characteristic, has an energy band gap greater than an energy band gap of the blue light emitting layer, and has a lowest unoccupied molecular orbital (LUMO) level that is greater than a LUMO level of the blue light emitting layer.

3. The white organic light emitting device of claim 2, wherein the first functional layer has a LUMO level of 2.3 eV to 2.6 eV.

4. The white organic light emitting device of claim 2, wherein the first functional layer has a highest occupied molecular orbital (HOMO) level of 5.2 eV to 5.8 eV.

5. The white organic light emitting device of claim 1, wherein the first functional layer includes at least one material selected from the group consisting of an oxadiazole compound having an amino substituent, a triphenyl compound having an amino substituent, a triphenylmethane compound having an amino substituent, a tertiary compound, a hydazone compound, a pyrazoline compound, an enamine compound, a styryl compound, a stilbene compound, and a carbazole compound.

6. The white organic light emitting device of claim 1, wherein the second functional layer has a thickness of about 10 angstrom to about 50 angstrom.

7. The white organic light emitting device of claim 1, wherein the second functional layer has a HOMO level of 5.7 eV to 6.4 eV.

8. The white organic light emitting device of claim 1, wherein the second functional layer has a lowest unoccupied molecular orbital (LUMO) level of 2.7 eV to 3.1 eV.

9. The white organic light emitting device of claim 1, wherein the second functional layer includes at least one material selected from the group consisting of an anthracene compound, a phenanthracene compound, a pyrene compound, a perylene compound, a chrysene compound, a triphenylene compound, a fluoranthene compound, a periflanthene compound, an azole compound, a diazole compound, and a vinylene compound.

10. The white organic light emitting device of claim 1, wherein the white organic light emitting device has an electron/hole balance factor of 0.8 to 1.0.

11. The white organic light emitting device of claim 1, wherein the hole transport layer has an electrical conductivity of $10^{-5}$ S/cm to $10^{-3}$ S/cm.

12. The white organic light emitting device of claim 1, wherein the electron transport layer has an electrical conductivity of $10^{-5}$ S/cm to $10^{-3}$ S/cm.

13. The white organic light emitting device of claim 1, wherein the hole transport layer is doped with a p-type dopant.

14. The white organic light emitting device of claim 1, wherein the electron transport layer is doped with an n-type dopant.

15. The white organic light emitting device of claim 1, further comprising an electron blocking layer formed between the hole transport layer and the light emitting layer.

16. The white organic light emitting device of claim 1, further comprising a hole blocking layer formed between the light emitting layer and the electron transport layer.

17. The white organic light emitting device of claim 16, wherein the hole blocking layer includes at least one material selected from the group consisting of an oxadiazole derivative, a triazole derivative, a phenanthroline derivative, a anthracene derivative, 2,9-Dimethyl-4,7-diphenyl-1,10-phenanhro-line (BCP), and an alumium complex.

18. The white organic light emitting device of claim 17, wherein the hole blocking layer includes an aluminum (III) bis(2-methyl-8-quinolinato) 4-phenylphenolate (Balq) layer.

19. The white organic light emitting device of claim 1, wherein the red light emitting layer comprises an organic host and a light emitting dopant, and the host has a highest occupied molecular orbital level of 5.2 eV to 5.8 eV.

20. The white organic light emitting device of claim 19, wherein the host has a hole transport characteristic.

21. The white organic light emitting device of claim 1, further comprising a hole injection layer formed between the anode and the hole transport layer.

22. The white organic light emitting device of claim 1, further comprising an electron injection layer formed between the cathode and the electron transport layer.

23. A full color display apparatus comprising:
 a white organic light emitting device of claim 1; and
 a color filter formed on the white organic light emitting device.

24. A liquid crystal display apparatus comprising the white organic light emitting device of claim 1 as a backlight unit.

25. A lighting apparatus comprising a white organic light emitting device of claim 1.

* * * * *